(12) United States Patent
Hwang et al.

(10) Patent No.: US 12,392,798 B2
(45) Date of Patent: Aug. 19, 2025

(54) SOCKET DEVICE FOR TESTING ICS

(71) Applicants: Dong Weon Hwang, Seongnam-si (KR); Logan Jae Hwang, Beverly Hills, CA (US); Jae Baek Hwang, Seongnam-si (KR); HICON CO., LTD., Seongnam-si (KR)

(72) Inventors: Dong Weon Hwang, Seongnam-si (KR); Logan Jae Hwang, Beverly Hills, CA (US); Jae Baek Hwang, Seongnam-si (KR)

(73) Assignees: Dong Weon Hwang, Seongnam-si (KR); Logan Jae Hwang, Beverly Hills, CA (US); Jae Baek Hwang, Seongnam-si (KR); HICON CO., LTD., Seongnam-si (KR)

( * ) Notice: Subject to any disclaimer, the term of this patent is extended or adjusted under 35 U.S.C. 154(b) by 166 days.

(21) Appl. No.: 18/506,878

(22) Filed: Nov. 10, 2023

(65) Prior Publication Data

US 2024/0183879 A1    Jun. 6, 2024

(30) Foreign Application Priority Data

Dec. 5, 2022    (KR) .......................... 10-2022-0167711

(51) Int. Cl.
*G01R 1/04*    (2006.01)
(52) U.S. Cl.
CPC .......... *G01R 1/0466* (2013.01); *G01R 1/0458* (2013.01); *G01R 1/0483* (2013.01)
(58) Field of Classification Search
CPC ... G01R 1/0466; G01R 1/0458; G01R 1/0483
See application file for complete search history.

(56) References Cited

U.S. PATENT DOCUMENTS 5,609,497 A  *  3/1997  Kawabe ............... H05K 7/1023
                                                        439/526
6,570,398 B2 *  5/2003  Murphy ............... G01R 1/0458
                                                      324/756.07

(Continued)

FOREIGN PATENT DOCUMENTS

JP          2001-281295 A       10/2001
JP          2017-37722 A         2/2017

(Continued)

OTHER PUBLICATIONS

Written Opinion PCT/KR2023/019160 (Year: 2024).*
Communication from KIPO in a counterpart foreign application KR10-2022-0167711, (6 pages).

*Primary Examiner* — Paresh Patel
(74) *Attorney, Agent, or Firm* — You & IP, LLC

(57) ABSTRACT

Proposed is a socket device for testing integrated circuits (ICs) used to test ICs. The socket device includes a contact module (100) for seating an IC and having a plurality of contacts (110) for electrical connection of a lead of the IC and a terminal of a printed circuit board (PCB), and a pusher module (200) having a latch (211) to be fit-assembled from a top of the contact module (100) and for pressurizing the IC, wherein the pusher module (200) includes a lead frame (210) with the latch rotatably provided thereto, a pressurizing part (220) (230) assembled to the lead frame (210) with two floating hinge axes (C1) (C2) parallel to each other and elastically supported against the lead frame, first and second cam shafts (240) (250) provided in the respective floating hinge axes (C1) (C2), a handle (260), a lever (270), and a link (280).

8 Claims, 14 Drawing Sheets

(56) References Cited

U.S. PATENT DOCUMENTS

| | | | |
|---|---|---|---|
| 7,030,638 B2* | 4/2006 | Stutzman | G01R 1/0466 |
| | | | 324/750.05 |
| 10,466,273 B1* | 11/2019 | Hwang | H01R 12/716 |
| 2010/0144190 A1* | 6/2010 | Yokoyama | H05K 7/1061 |
| | | | 439/487 |
| 2010/0159731 A1* | 6/2010 | Kunioka | H01R 13/2492 |
| | | | 439/73 |
| 2012/0100730 A1* | 4/2012 | Yokoyama | G01R 1/0466 |
| | | | 439/68 |
| 2016/0308293 A1* | 10/2016 | Narumi | H01R 12/714 |
| 2017/0117652 A1* | 4/2017 | Hachuda | H01R 13/11 |
| 2017/0315150 A1* | 11/2017 | Park | G01R 1/0433 |

FOREIGN PATENT DOCUMENTS

| | | |
|---|---|---|
| KR | 10-2014-0045627 A | 4/2014 |
| KR | 10-2016-0084039 A | 7/2016 |
| KR | 10-1926387 B1 | 12/2018 |
| KR | 10-2022-0020718 A | 2/2022 |

* cited by examiner

SOCKET DEVICE FOR TESTING ICS

CROSS REFERENCE TO RELATED APPLICATION

The present application claims priority to Korean Patent Application No. 10-2022-0167711, filed Dec. 5, 2022, the entire contents of which is incorporated herein for all purposes by this reference.

BACKGROUND OF THE INVENTION

Field of the Invention

The present disclosure relates to a socket device for testing integrated circuits (ICs) used to test ICs.

Description of the Related Art

In general, integrated circuit (IC) sockets are provided on test boards or burn-in boards and used in a system for a series of IC tests as burn-in chambers or peripheral devices thereof that allow input and output of power and electrical signals required to drive an IC and separate test devices to measure the characteristics of the IC are connected through input/output (I/O) terminals located on the boards (test boards, burn-in boards).

Among widely used ICs, a ball grid array (BGA)-type IC innovatively reduces the size and thickness of an IC by arranging IC leads, that is, balls, on the entire underside of the IC.

On the other hand, a land grid array (LGA)-type IC is a BGA-type IC with no ball attached to a pad (or land).

Recently, a variety of LGA-type or BGA and LGA combination-type ICs are produced, and a socket for testing an LGA-type or combination-type IC is equipped with a plurality of contacts with a predetermined elastic force in the up and down directions, and lower terminals of a contact are connected to a printed circuit board (PCB) by contact or soldering.

In this case, upper terminals of the contact are provided to contact leads of an IC loaded into the socket, and the socket needs to be equipped with a pressurizing device that presses the IC downward to ensure electrically stable contact.

For reference, the physical force applied per contact may be calculated by dividing the physical force applied to the upper surface of an IC by a pressurizing device by the number of contacts.

To be specific, the physical force applied to contacts is approximately 10 gf per contact. For example, when an IC has 500 leads, a strong physical force of about 5.0 Kgf needs to be applied.

Therefore, a socket for testing ICs requires a pressurizing means that can effectively apply the strong physical force as described above to an IC.

As the number of IC leads increases, lead pitch becomes narrower, and ICs become thinner, there is a need for a socket that is equipped with a pressurizing means that can apply strong pressure while keeping the entire surface of an IC even in response to the upward contact force applied to leads of the IC especially when conducting a burn-in test at high temperature for a long time.

As an example of conventional socket, Korean Patent Application Publication No. 10-2022-0020718 discloses a test device provided with a rotary-type handle mechanism for performing rotational manipulation at the top of the test device. However, it is difficult to add a heating package such as a heat sink or a heat dissipation fan to such a rotary-type test device.

Documents of Related Art (Patent Document 0001) Korean Patent Application Publication No. 10-2022-0020718 (published Feb. 21, 2022)

SUMMARY OF THE INVENTION

Accordingly, the present disclosure has been made keeping in mind the above problems occurring in the related art, and the present disclosure is intended to provide a socket device for testing integrated circuits (ICs) used to test ICs and, more particularly, to a socket device that prevents damage to an IC by applying uniform pressing force to the entire upper surface of the IC during the IC loading process.

An objective of the present disclosure is to provide a socket device that facilitates the installation of a heating package such as a heat sink and a heat dissipation fan along with a pressurization mechanism that applies pressure to an IC during the IC loading process.

In order to achieve the above objective, according to an embodiment of the present disclosure, there is provided a socket device for testing integrated circuits (ICs), including: a contact module for seating an IC and having a plurality of contacts for electrical connection of a lead of the IC and a terminal of a printed circuit board (PCB); and a pusher module having a latch to be fit-assembled from a top of the contact module and for pressurizing the IC, wherein the pusher module may include: a lead frame with the latch rotatably provided thereto; a pressurizing part assembled to the lead frame with two floating hinge axes parallel to each other and elastically supported against the lead frame to be movable up and down to elastically pressurize the IC; first and second cam shafts provided in the respective floating hinge axes to adjust a vertical height of the pressurizing part depending on a rotation angle thereof; a handle rotatably fixed with the first cam shaft; a lever rotatably fixed with the second cam shaft; and a link having opposite ends rotatably connected to the handle and the lever.

Preferably, the pressurizing part may include: a heat sink frame having a first elastic body disposed and assembled with the lead frame by means of the first and second cam shafts; and a pusher block provided with a second elastic body to be elastically supported against the heat sink frame and having a pressurizing surface that elastically pressurizes the IC.

More preferably, each of the first and second cam shafts may include: a first section having a circular cross-section and rotatably assembled with the lead frame; and a second section extending from the first section and having a cam surface that forms a plane in an axial direction on a portion of an outer peripheral surface of each of the first and second cam shafts to be assembled with the heat sink frame.

More preferably, the heat sink frame may include a floating hinge part formed with a floating hinge hole through which each of the first and second cam shafts is inserted, wherein the floating hinge hole may have a flat surface that makes surface contact with the cam surface.

Preferably, the heat sink frame and the pusher block may be respectively provided with a first opening and a second opening formed through approximately a center thereof, and a heat sink may be further included, the heat sink being equipped with a plurality of heat dissipation fins, provided on top of the heat sink frame, inserted into the first and second openings, and having a pressurizing surface that pressurizes an IC. More preferably, the heat sink may be provided with a third elastic body and may be elastically assembled with the heat sink frame.

According to an embodiment of the present disclosure, there is provided a pusher device for being assembled with a contact module of a socket device to electrically connect a lead of an IC and a terminal of a printed circuit board (PCB) to pressurize the IC. The pusher device includes: a lead frame with a latch rotatably provided thereto to be fit-assembled from a top of the contact module; a pressurizing part assembled to the lead frame with two floating hinge axes parallel to each other and elastically supported against the lead frame to be movable up and down to elastically pressurize the IC; first and second cam shafts provided in the respective floating hinge axes to adjust a vertical height of the pressurizing part depending on a rotation angle thereof; a handle rotatably fixed with the first cam shaft; a lever rotatably fixed with the second cam shaft; and a link having opposite ends rotatably connected to the handle and the lever.

A socket device for testing integrated circuits (ICs) according to the present disclosure includes a contact module and a pusher module that is fit-assembled from the top of the contact module and pressurizes an IC, wherein the pusher module includes: a lead frame; a pressurizing part assembled to the lead frame with two floating hinge axes C21 and C22 and elastically supported against the lead frame to be movable up and down to elastically pressurize the IC; first and second cam shafts provided in the respective floating hinge axes C21 and C22 to adjust the vertical height of the pressurizing part depending on a rotation angle thereof; a handle rotatably fixed with the first cam shaft; a lever rotatably fixed with the second cam shaft; and a link having opposite ends rotatably connected to the handle and the lever, so that the IC is pressed with uniform pressing force, thereby preventing damage to the IC.

Furthermore, according to a socket device for testing integrated circuits (ICs) of the present disclosure, it is easy to install heating means such as a heat sink or a cooling fan on the upper portion of a pressurizing part.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
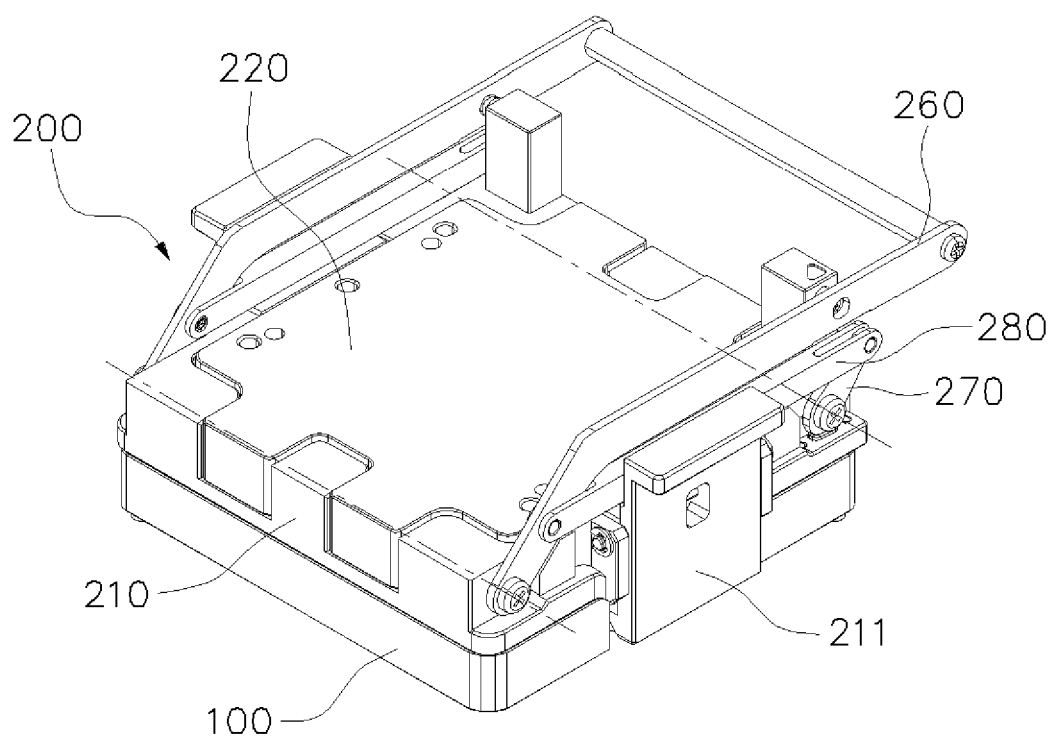
FIG. 1 is a perspective view of a socket device for testing integrated circuits (ICs) according to an embodiment of the present disclosure.

Terms and words used in this specification and claims should not be construed as limited to their ordinary or dictionary meanings, and should be interpreted as meaning and concept consistent with the technical idea of the present disclosure on the basis of the principle that an inventor can appropriately define terminological concepts to best describe his or her invention.

Accordingly, an embodiment described in this specification and the configuration shown in the drawings are only one of the most preferred embodiments of the present disclosure, and do not represent the entire technical idea of the present disclosure. Therefore, it should be understood that at the time of filing this application, there may be various equivalents and modifications that can replace the embodiment and the configuration.

Hereinafter, preferred embodiments of the present disclosure will be described in detail with the accompanying drawings. Meanwhile, in the drawings below, the size of certain components may be relatively exaggerated to aid understanding of the invention, and when there is no need to distinguish between multiple identical components, the identical components may be expressed as one representative.

Figure 2A:
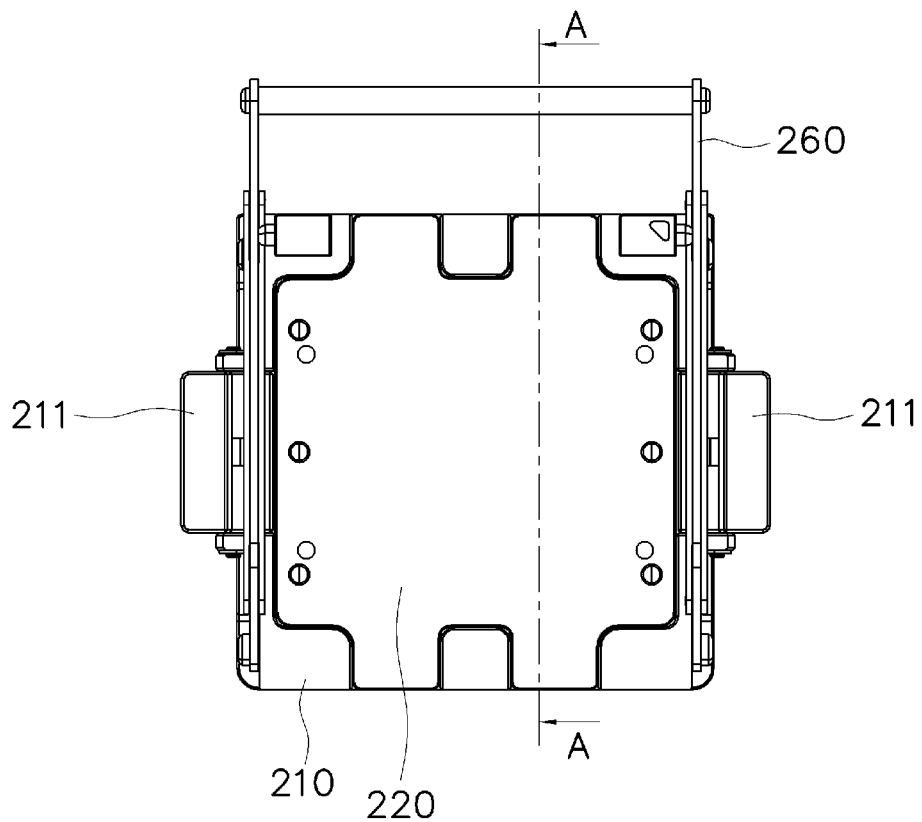
FIGS. 2A and 2B are a plan view and a side view respectively of the socket device for testing integrated circuits (ICs) according to the embodiment of present disclosure.
Figure 2B:
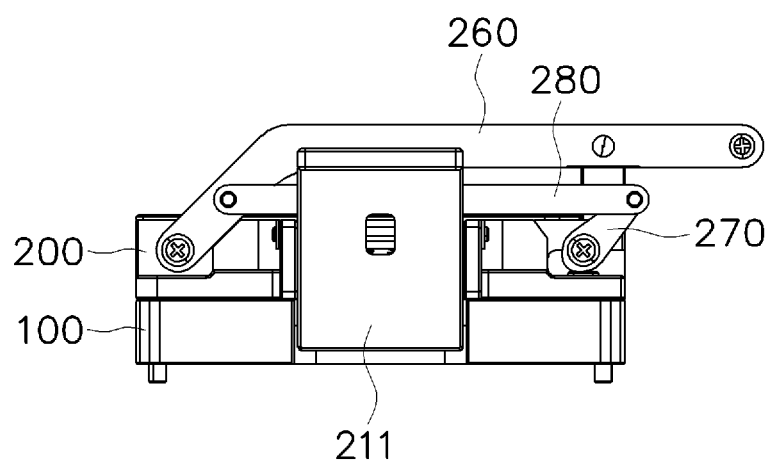
Figure 3:
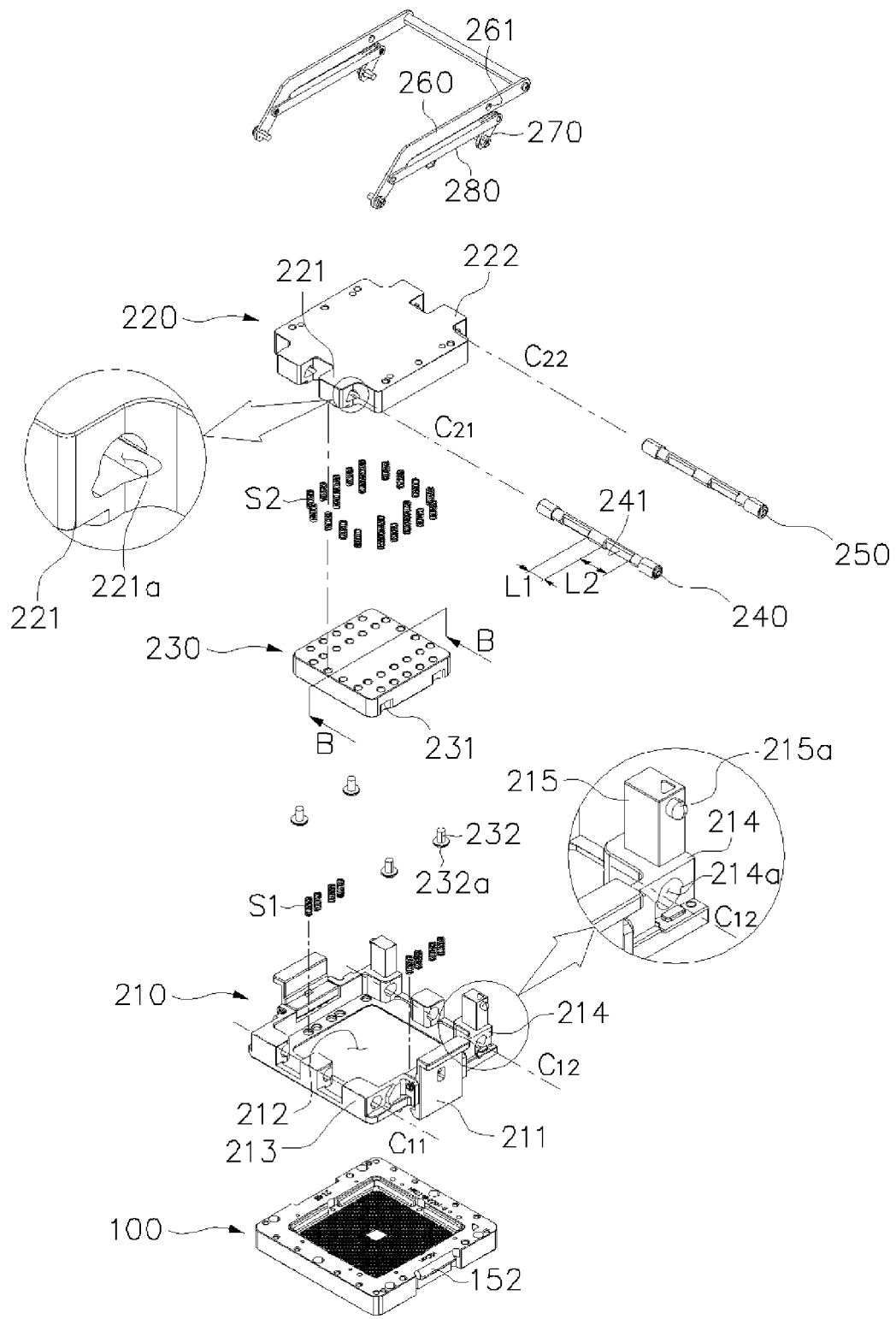
FIG. 3 is an exploded perspective view of the socket device for testing integrated circuits (ICs) according to the embodiment of the present disclosure.
Figure 4:
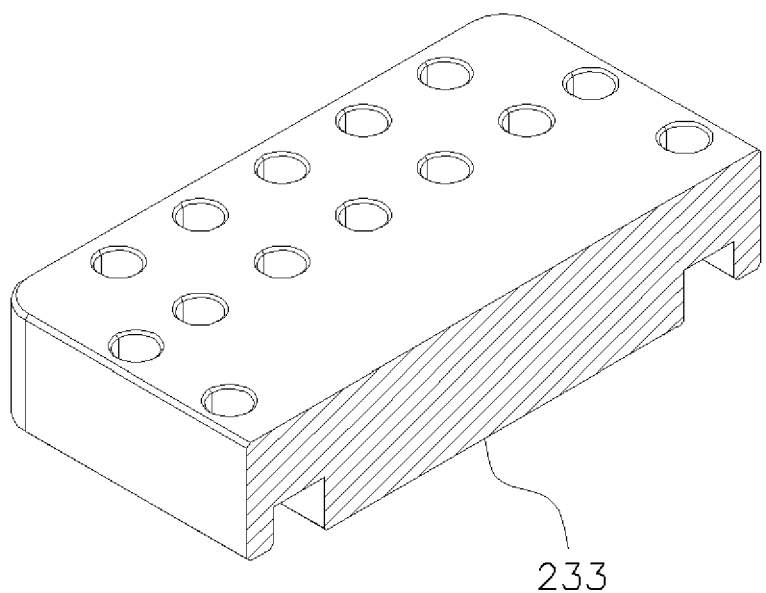
FIG. 4 is a cross-sectional view along line B-B of FIG. 3.
Figure 5:
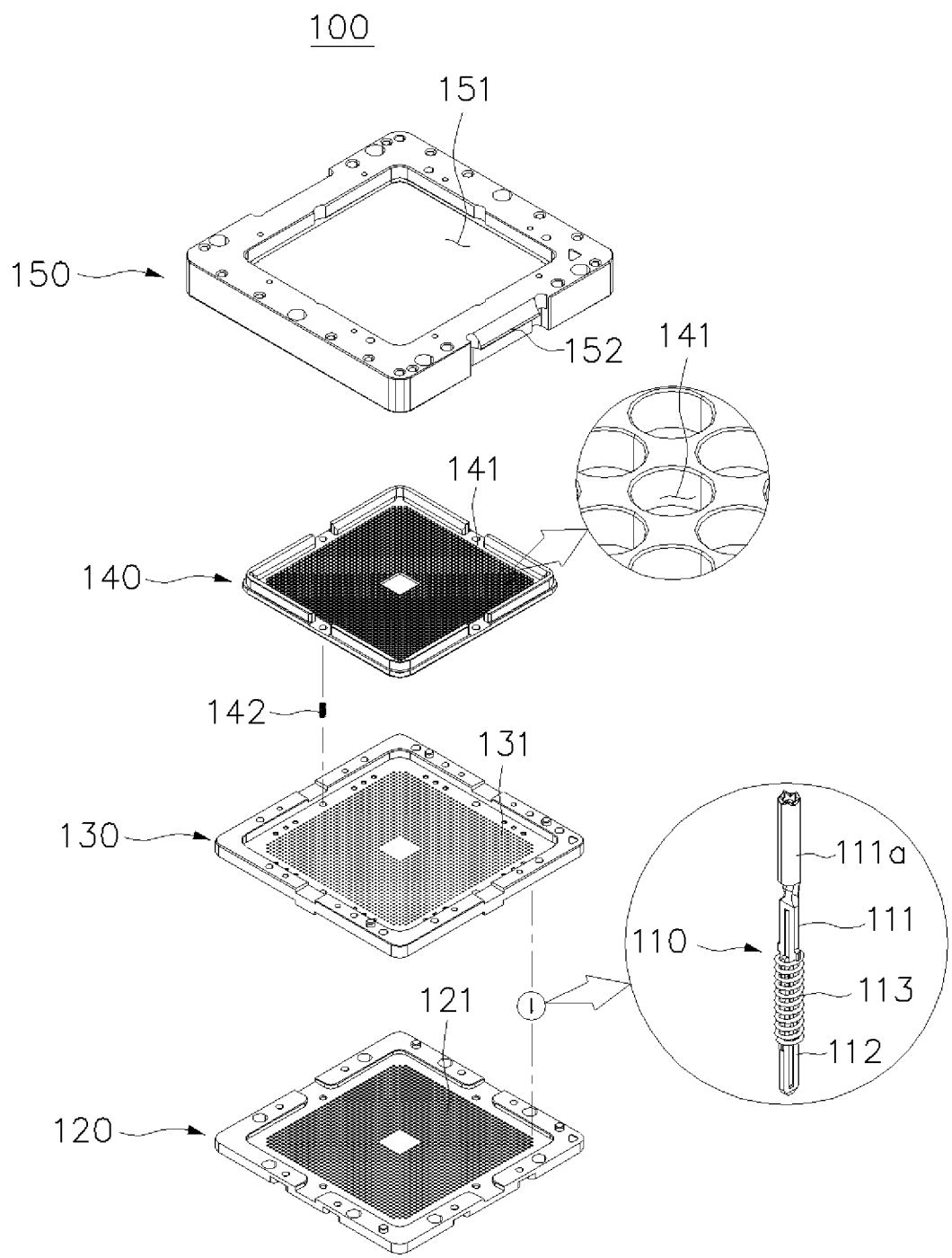
FIG. 5 is an exploded perspective view of a contact module of the socket device for testing integrated circuits (ICs) according to the embodiment of the present disclosure.

FIG. 1 is a perspective view of a socket device for testing integrated circuits (ICs) according to an embodiment of the present disclosure; FIGS. 2A and 2B are a plan view and a side view respectively of the socket device for testing integrated circuits (ICs) according to the embodiment of present disclosure; FIG. 3 is an exploded perspective view of the socket device for testing integrated circuits (ICs) according to the embodiment of the present disclosure; FIG. 4 is a cross-sectional view along line B-B of FIG. 3; and FIG. 5 is an exploded perspective view of a contact module of the socket device for testing integrated circuits (ICs) according to the embodiment of the present disclosure.

Referring to FIGS. 1 to 5, the socket device includes a contact module 100 provided with a plurality of contacts 110, and a pusher module 200 equipped with a latch 211 and fitted to and assembled from the top of the contact module 100 to press an integrated circuit.

In particular, referring to FIG. 5, the contact module 100 is for seating an integrated circuit (hereinafter abbreviated as "IC") to electrically connect a lead of the IC and a terminal of a printed circuit board (PCB), and includes a lower body 120 and an upper body 130. The contact module 100 may further include a floating plate 140 and a base frame 150.

The lower body 120 and the upper body 130 have a roughly square structure. Holes 121 and 131 into which contacts 110 are inserted are formed in the lower body 120 and the upper body 130, so that each contact 110 is accommodated and fixed between the lower body 120 and the upper body 130 to electrically connect the lead of the IC and the terminal of the PCB.

In the present embodiment, the contact 110 consists of an upper contact pin 111, a lower contact pin 112, and a spring 113. The upper contact pin 111 and the lower contact pin 112 are assembled so as to slide up and down, and the spring 113 is elastically supported between the upper contact pin 111 and the lower contact pin 112. The upper contact pin 111 may include an upper head 111a having an upper tip. Due to the elastic force of the spring 113, the upper head 111a is pressed in the direction of the lead of the IC, and the lower contact pin 112 is pressed in the direction of the terminal of the PCB, so that the contact 110 electrically connects each lead of the IC and each terminal the PCB. Meanwhile, the present disclosure is not limited to this contact, and various well-known socket contacts may be used as long as the lead of the IC and the terminal of the PCB can be electrically connected.

Preferably, a spring 142 is disposed on the upper body 130 to elastically provide the floating plate 140, and an IC for testing is seated on the floating plate 140.

The IC seating surface of the floating plate 140 may be formed with a plurality of ball lead receiving holes 141 to accommodate (ball) leads of the IC, and the upper head 111a of the contact 110 is positioned through the ball lead receiving hole 141. The ball lead receiving hole may be omitted depending on the lead type of the IC (land grid array; LGA). Meanwhile, in FIG. 5, although only one spring 142, which provides elastic support between the upper body 130 and the floating plate 140, is shown, a plurality of springs may be disposed between the upper body 130 and the floating plate 140 within a range that can elastically support the floating plate 140 horizontally.

The base frame 150 has an opening 151 through which the IC may penetrate, and includes a latch fixing protrusion 152 through which the latch of the pusher module is fixed. The lower body 120 and the upper body 130 are sequentially fixed to the base frame 150 by fastening members such as bolts, and the floating plate 140 disposed on the upper body 130 is assembled with the base frame 150 to be able to move up and down. The base frame 150 may include mounting holes or mounting pins for assembly on the PCB.

Referring back to FIGS. 1 to 4, the pusher module 200 includes a lead frame 210, pressurizing parts 220 and 230, first and second cam shafts 240 and 250, a handle 260, a lever 270, and a link 280.

The lead frame 210 has an opening 212 through which the pressurizing parts 220 and 230 are positioned, and includes a latch 211 that may be fixed to the contact module 100. In the present embodiment, the latch 211 is provided on two opposing sides among the four sides of the lead frame 210, is hinge-assembled to the lead frame 210, and is fixed to the latch fixing protrusion 152 of the contact module 100. Preferably, the latch 211 is provided with an elastic body (spring) to provide operating force for pressurizing in the direction of fixation with the latch fixing protrusion 152 of the contact module 100, and is elastically fixed to the latch fixing protrusion 152.

The lead frame 210 is provided with hinge blocks 213 and 214 for assembling the pressurizing parts 220 and 230 on the remaining two opposing sides of the four sides, excluding the sides where the latches 211 are placed. The hinge blocks 213 and 214 are composed of a first hinge block 213 and a second hinge block 214, and a circular axial hole 214a is formed through each hinge block 213 and 214. Reference numerals C11 and C12 represent the hinge axes of the axial holes of the first hinge block 213 and the second hinge block 214, respectively. Handle fixing members 215 and 215a may be formed to extend integrally from the upper portion of the second hinge block 214. In the present embodiment, the handle fixing members 215 and 215a are composed of a handle fixing block 215 and a handle fixing protrusion 215a that protrudes from the outer wall of the handle fixing block 215.

The pressurizing parts 220 and 230 are assembled to the lead frame 210 with two floating hinge axes C21 and C22 in parallel with each other and elastically supported against the lead frame 210 to be movable up and down, thereby elastically pressurizing an IC.

Preferably, the pressurizing parts 220 and 230 are composed of: a heat sink frame 220 having a first elastic body S1 and assembled with the lead frame 210 by means of the first and second cam shafts 240 and 250; and a pusher block 230 provided under the heat sink frame 220 to elastically pressurize an IC by a second elastic body S2. The first elastic body S1 and the second elastic body S2 may be provided as known compression springs, but are not limited thereto. The first elastic body S1 provides a reaction force to return the heat sink frame 220 to the initial position thereof when the pressing force on the IC is released, and the second elastic body S2 provides the pressing force on the IC.

The first elastic body S1 is interposed between the lead frame 210 and the heat sink frame 220 and elastically supports the heat sink frame 220 upward. The second elastic body S2 is interposed between the heat sink frame 220 and the pusher block 230 and elastically supports the pusher block 230 downward, providing a pressing force for the pusher block 230 to press the IC.

The heat sink frame 220 has two floating hinge axes C21, C22 and is assembled with the lead frame 210, and due to the floating hinge axes C21 and C22, the heat sink frame 220 may move up and down within a predetermined height range in the vertical direction with respect to the lead frame 210. In the following description, since the two floating hinge axes C21 and C22 have the same configuration and operation, only the reference numerals for one floating hinge axis will be used without distinction in the description of the related embodiments, and if distinction is necessary, two floating hinge axes will be described as the first flow hinge axis C21 and the second flow hinge axis C22.

To be specific, the heat sink frame 220 includes floating hinge parts 221 and 222 respectively corresponding to hinge blocks 213 and 214 of the lead frame 210 and assembled by means of the first and second cam shafts 240 and 250, and each of the floating hinge parts 221 and 222 is formed with a floating hinge hole 221a through which the cam shaft 240 or the cam shaft 250 is assembled. Meanwhile, the cam shaft 240 includes a first section L1 with a circular cross-section and a second section L2 extending from the first section L1 and having a cam surface 241 that forms a plane in the axial direction on a portion of the outer peripheral surface of the cam shaft 240. The first section L1 is a section inserted into the circular axial hole 214a of the lead frame 210, and the second section L2 is a section inserted into the hinge hole 221a of the heat sink frame 220. Thus, the second section L2 in which the cam surface 241 is formed on the cam shaft 240 is approximately determined by the position of the floating hinge part 221 of the heat sink frame 220.

The upper portion of the hinge hole 221a of the floating hinge part 221 has an arcuate surface having approximately the same curvature as the cam shaft 240, while the lower portion of the hinge hole 221a has a flat surface that makes surface contact with the cam surface. Accordingly, depending on the rotation angle of the cam shafts 240 and 250 provided in the floating hinge axes C21 and C22, the heat sink frame 220 may move up and down within a predetermined height range.

The pusher block 230 is provided beneath the heat sink frame 220, and the second elastic body S2 is interposed to elastically press the IC. Preferably, the pusher block 230 includes a flat pressurizing surface 233 at the lower portion thereof, and the pressurizing surface 233 is in direct surface contact with the upper surface of the IC. The pusher block 230 has one or more stopper grooves 231 formed approximately along the lower edge thereof. As the stopper groove 231 is caught by a bolt head 232a of a stopper bolt 232 fastened to the heat sink frame 220, the downward movement range of the pusher block 230 is limited.

Preferably, the heat sink frame 220 and the pusher block 230 may be made of a metal material with excellent heat conduction. In addition, an additional heat generating unit or heating unit may be installed on the top of the heat sink frame 220, so that the test may be conducted by heating or cooling an IC under test to an appropriate temperature.

The handle 260, the lever 270, and the link 280 are provided in pairs symmetrically on the left and right sides of the socket device to form a handle unit, and by operating the handle unit, a pressing force that pressurizes an IC is generated.

The handle 260 and the lever 270 are rotatably fixed to the rotation axes of the first cam shaft 240 and the second cam shaft 250, respectively, and the link 280 is connected between the handle 260 and the lever 270. Thus, the operating force generated by manipulating the handle 260 is transmitted to the lever 270 through the link 280, and the first cam shaft 240 and the second cam shaft 250 are linked and rotated by the same angle according to the operation angle of the handle 260. The handle 260 is provided with a fixing hole 261 that is inserted into the handle fixing protrusion 215a, which is a handle fixing member, so that the closed state of the handle 260 is fixed.

Figure 6A:
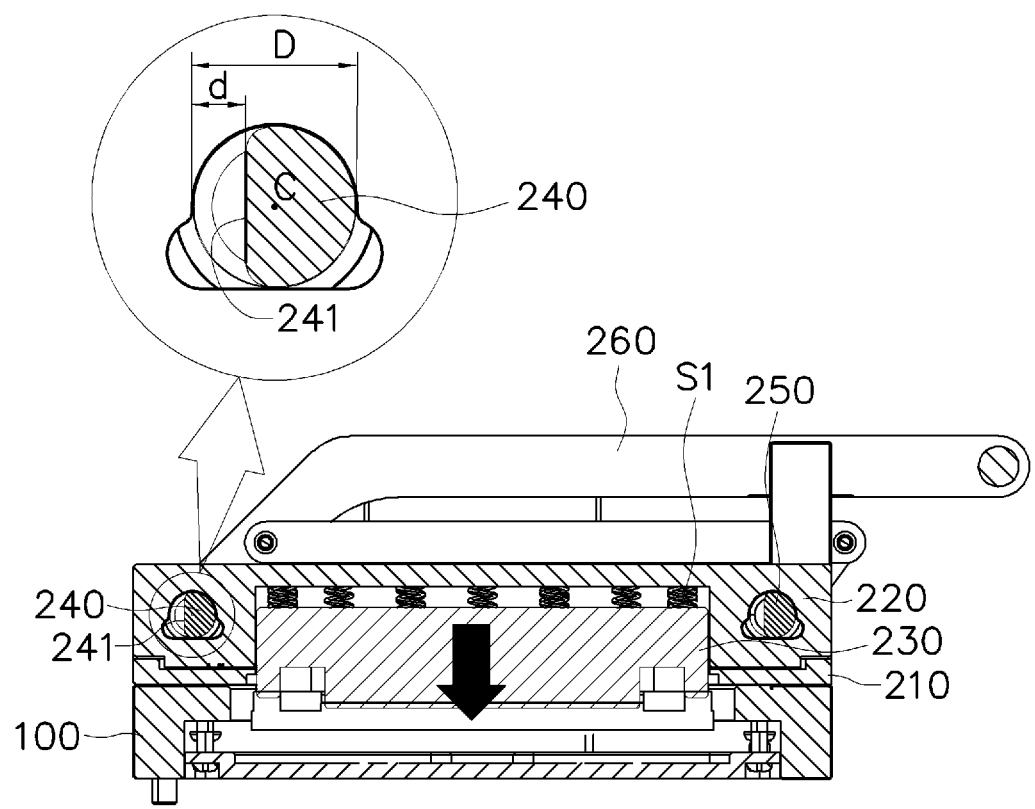
FIGS. 6A and 6B are cross-sectional views showing the operation before and after pressurizing on the cross-section along line B-B of FIG. 2A.
Figure 6B:
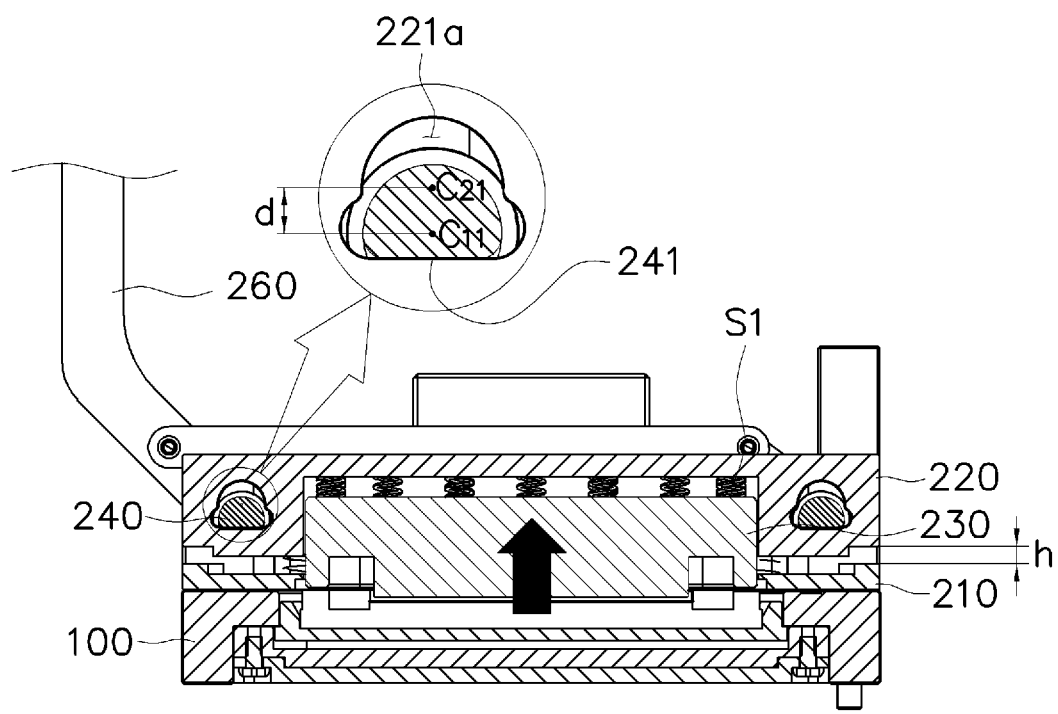

FIGS. 6A and 6B are cross-sectional views showing the operation before and after pressurization of the socket device for testing integrated circuits (ICs) according to the embodiment of the present disclosure. FIG. 6A shows a state in which the handle is in a closed state and a pressing force is generated on an IC, and FIG. 6B shows a state in which the handle is in an open state and the pressing force on the IC is removed. As previously described, due to the manipulation of the handle, the first cam shaft and the second cam shaft are synchronized and rotated by the same angle. Thus, the following description will focus on the first cam shaft.

The open/close manipulation position (vertical/horizontal) of the handle 260 is performed in a range of approximately 90°, and the cam surface 241 of the first cam shaft 240 linked thereto also rotates in a range of approximately 90°.

Before assembling the contact module 100 and the pusher module 200, an IC is loaded into the contact module 100. Afterwards, the pusher module 200 is placed on the contact module 100, and the latch 211 of the pusher module 200 is engaged with the latch fixing protrusion 152 of the contact module 100, so that the contact module 100 and the pusher module 200 are fixed to each other. Thereafter, a pressing force on the IC is generated by rotating the handle 260 by 90° as shown in FIG. 6A.

FIG. 6A shows a state in which a pressing force is generated on the IC when the handle 260 is closed, and the cam surface 241 of the first cam shaft 240 is oriented to the left, and the pusher block 230 pressurizes the top of the IC due to the first cam shaft 240 that hinges both ends of the lead frame 210 and the heat sink frame 220. Meanwhile, when IC pressing force occurs, the hinge axes C11 and C12 of the lead frame 210 and the hinge axes C21 and C22 of the heat sink frame 220 are located on the same axis C (C11=C21) (C12=C22). Reference numeral D represents the diameter in the circular cross-section section of the first cam shaft 240, and reference numeral d represents the step difference in the cam surface 241 section. In the closed state of the handle 260, both the first elastic body S1 interposed between the lead frame 210 and the heat sink frame 220 and the second elastic body S2 interposed between the heat sink frame 220 and the pusher block 230 (see FIG. 3) are compressed to the maximum displacement.

FIG. 6B shows a state in which the pressing force on the IC is released when the handle 260 is open. Due to the rotational operation of the handle 260, the first cam shaft 240 rotates counterclockwise so that the cam surface 241 and the lower flat surface of the first floating hinge hole 221a come into surface contact, and due to the reaction force of the first elastic body S1, the heat sink frame 220 moves upward by a predetermined height h, and the second elastic body S2 interposed between the heat sink frame 220 and the pusher block 230 (see FIG. 3) is relaxed and the pressing force is removed. In the handle open state, the hinge axis C21 of the heat sink frame 220 is offset by the step difference d created by the cam surface 241 with respect to the hinge axis C11 of the lead frame 210, and the size of this offset is approximately equal to the upward movement height h of the heat sink frame 220 (d≈h).

In the socket device of the present disclosure configured as described above, when the handle 260 is rotated, the pressurizing parts 220 and 230 are assembled with both ends of the lead frame 210 by the floating hinge axes to move up and down, and the vertical movement occurs while the entire pressurizing parts 220 and 230 remain horizontal, thereby generating a uniform pressing force over the entire upper surface of the IC.

Figure 7:
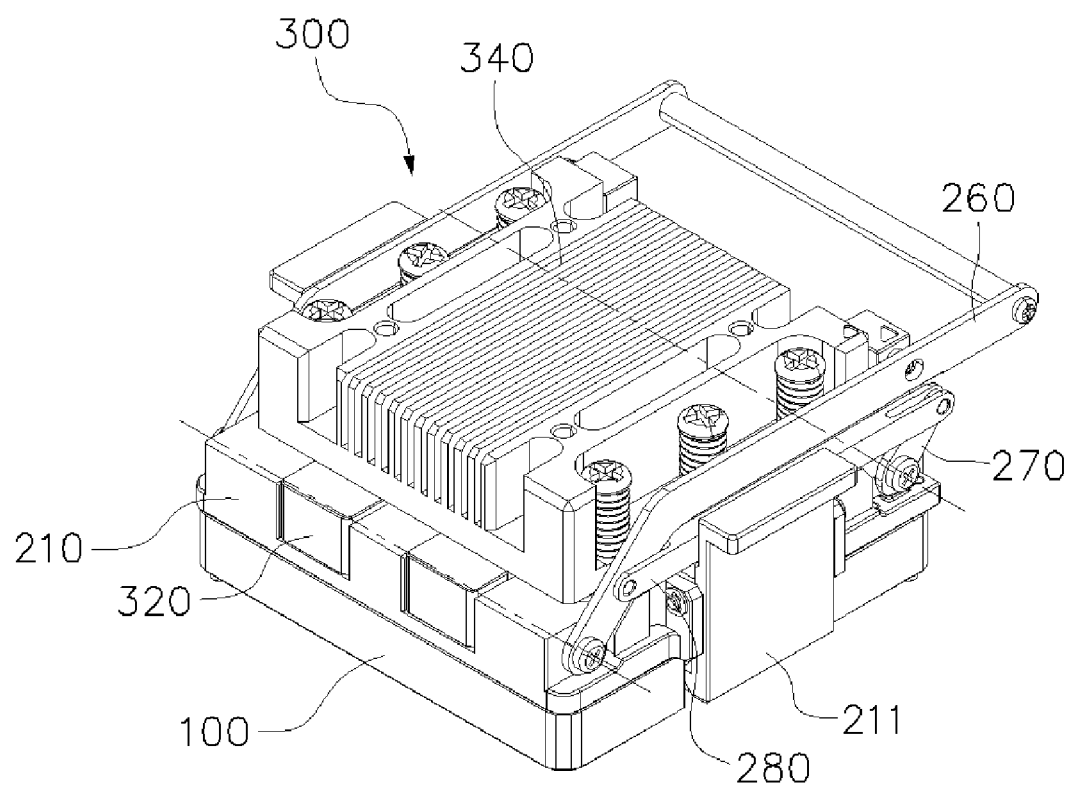
FIG. 7 is a perspective view of a socket device for testing integrated circuits (ICs) according to another embodiment of the present disclosure.
Figure 8:
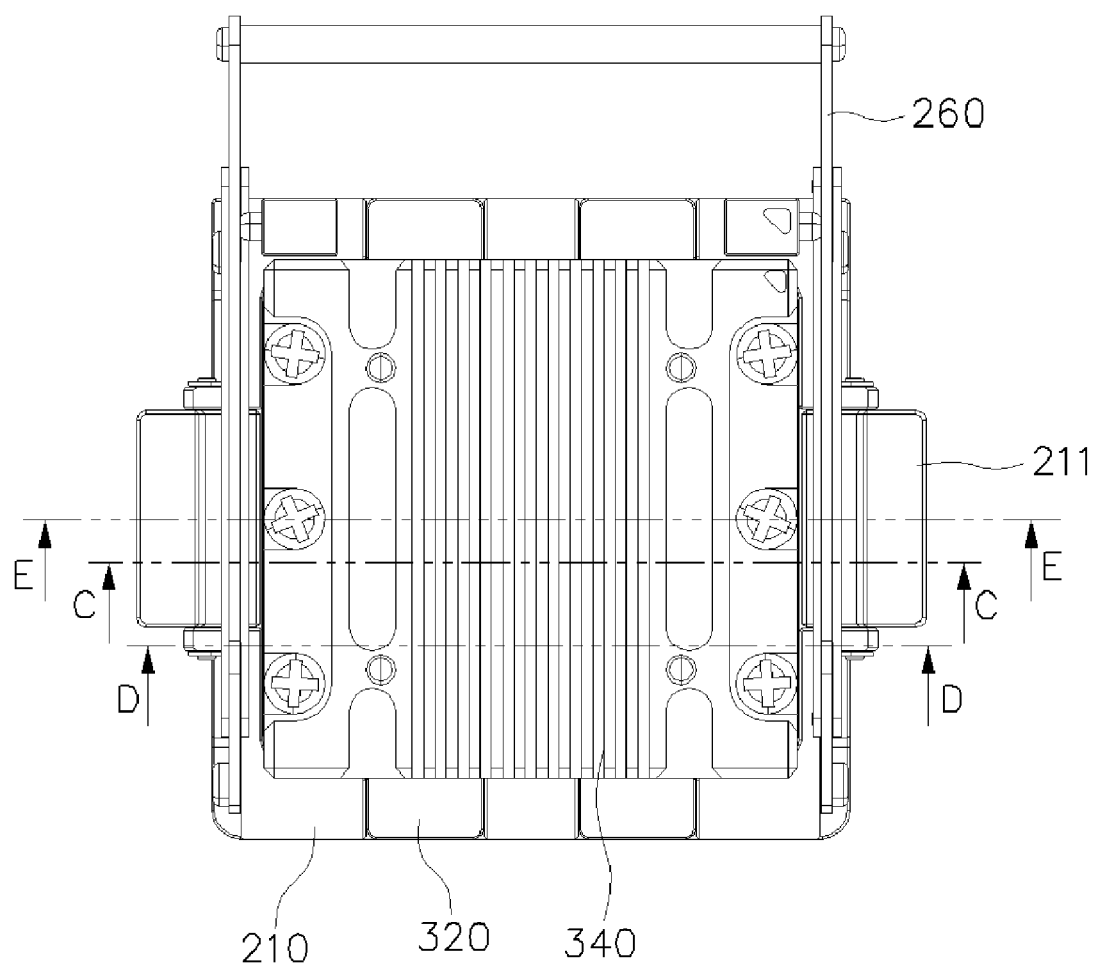
FIG. 8 is a plan view of the socket device for testing integrated circuits (ICs) according to another embodiment of the present disclosure.
Figure 9:
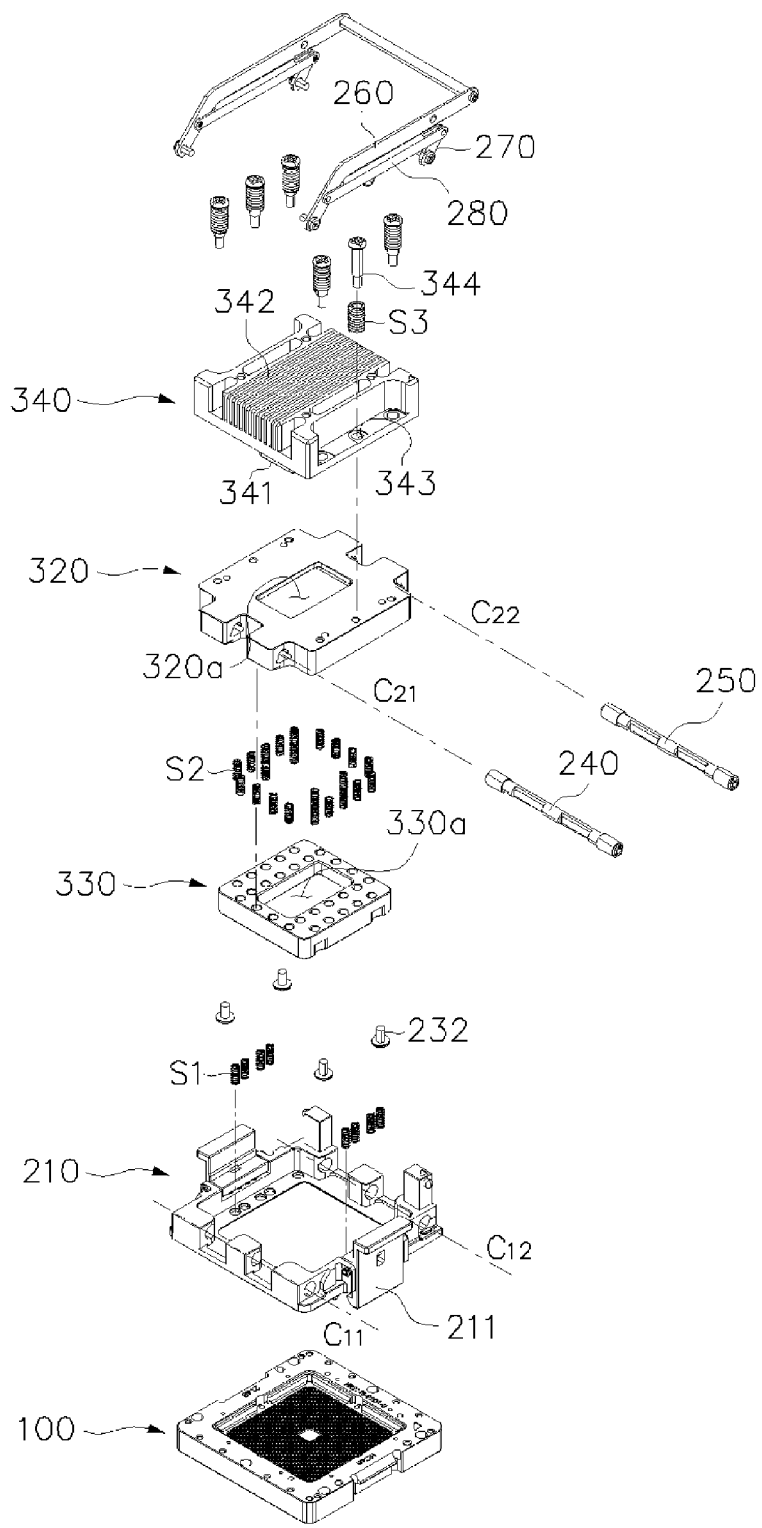
FIG. 9 is an exploded perspective view of the socket device for testing integrated circuits (ICs) according to another embodiment of the present disclosure.
Figure 10:
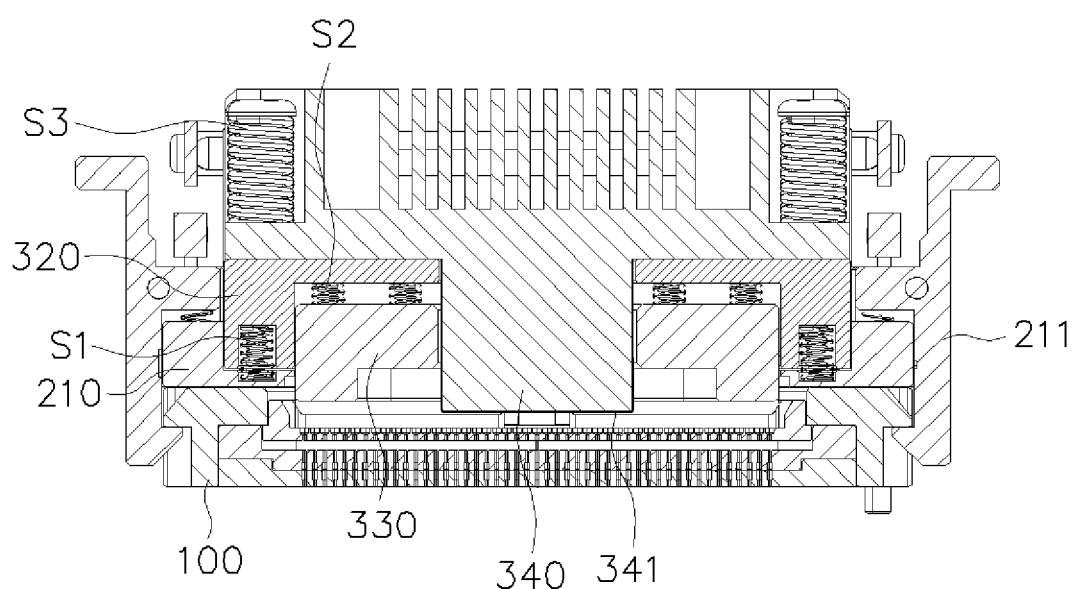
FIG. 10 is a cross-sectional view along line C-C of FIG. 8.
Figure 11:
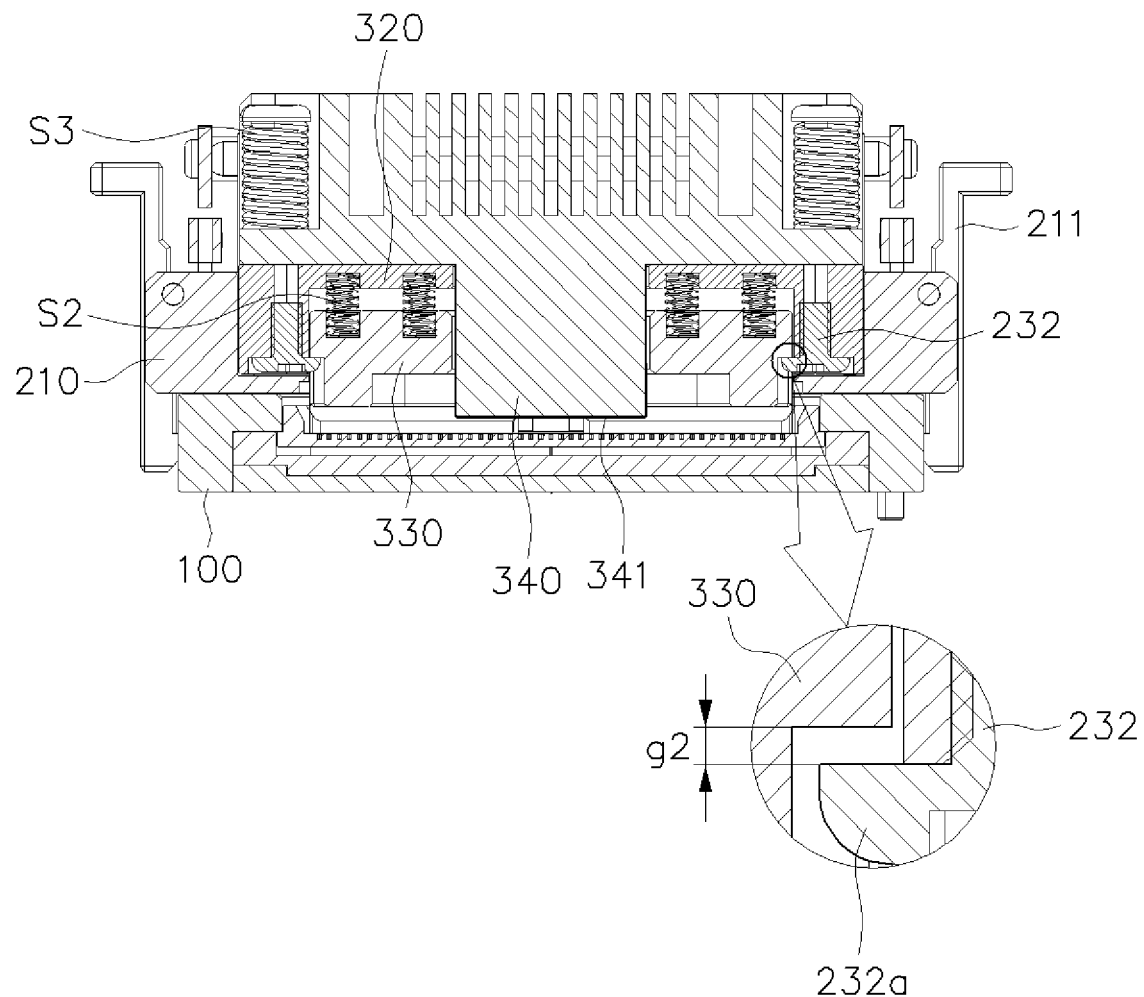
FIG. 11 is a cross-sectional view along line D-D of FIG. 8.
Figure 12:
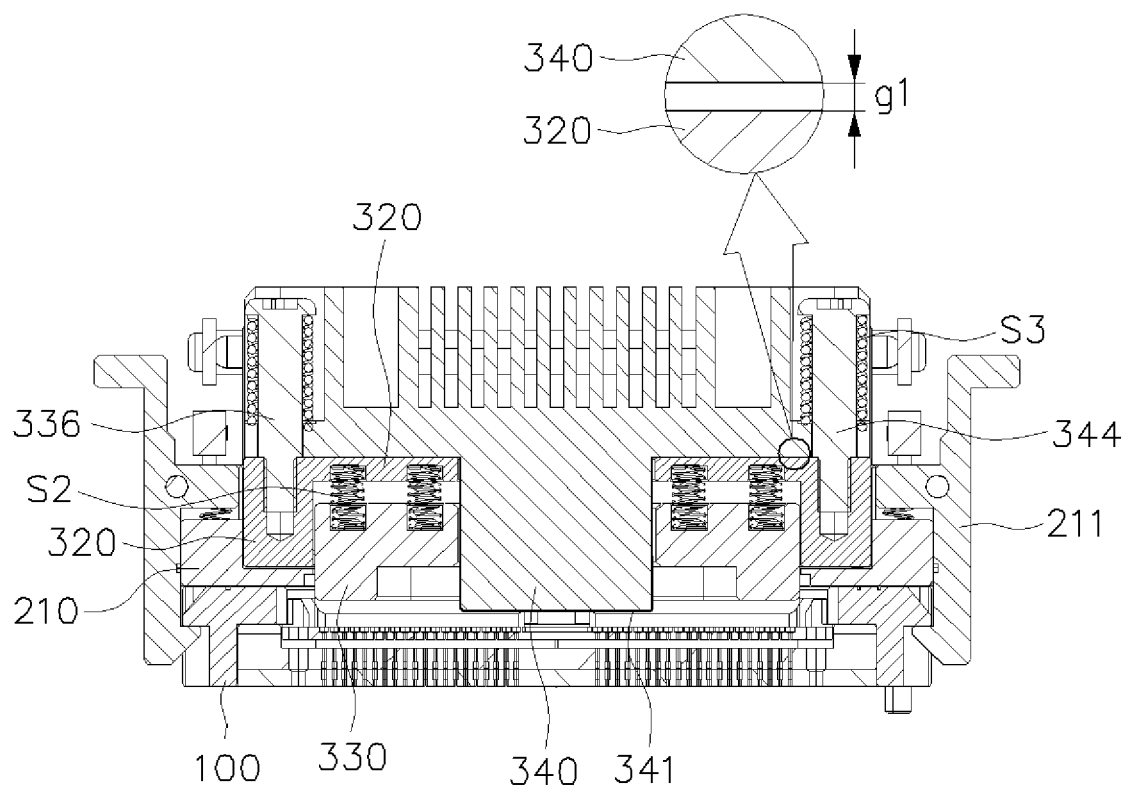
FIG. 12 is a cross-sectional view along line E-E of FIG. 8.

FIG. 7 is a perspective view of a socket device for testing integrated circuits (ICs) according to another embodiment of the present disclosure; FIG. 8 is a plan view of the socket device for testing integrated circuits (ICs) according to another embodiment of the present disclosure; FIG. 9 is an exploded perspective view of the socket device for testing integrated circuits (ICs) according to another embodiment of the present disclosure; FIG. 10 is a cross-sectional view along line C-C of FIG. 8; FIG. 11 is a cross-sectional view along line D-D of FIG. 8; and FIG. 12 is a cross-sectional view along line E-E of FIG. 8. FIGS. 7 to 12 show a handle in a closed state, and an IC is not shown. In the following description, the same numerals as the previous embodiment will be used for the same configuration, redundant explanation will be omitted, and the description will focus on the differences.

Referring to FIGS. 7 to 12, the socket device for testing integrated circuits (ICs) according to another embodiment of the present disclosure includes a contact module 100 and a pusher module 200, and the contact module 100 is the same as in the previous embodiment The pusher module 200 includes a lead frame 210, pressurizing parts 320, 330, and 340, first and second cam shafts, a handle 260, a lever 270, and a link 280. The pressurizing parts 320, 330, and 340 may include a heat sink frame 320, a pusher block 330, and a heat sink 340.

The lead frame 210 includes a latch 211 fixed to the contact module 100. The heat sink frame 320 is assembled to the lead frame 210 with two floating hinge axes C21 and C22 by means of a pair of cam shafts 240 and 250, and is elastically supported on the upper part of the lead frame 210 by a first elastic body S1 to be movable up and down, which is the same as in the previous embodiment. In addition, the handle 260 and the lever 270 being fixed to the floating hinge axes C21 and C22, respectively, and the heat sink frame 320 moving up and down due to the manipulation of the handle 360, which includes the link 280 connecting the handle 260 and the lever 270, are also the same as in the previous embodiment.

Preferably, in this embodiment, the heat sink frame 320 and the pusher block 330 are respectively provided with a first opening 320a and a second opening 330a formed through approximately the center thereof. The heat sink 340 is provided on top of the heat sink frame 320, is inserted into the first opening 320a and the second opening 330a, and has a pressurizing surface 341 that directly pressurizes the upper portion of the IC. The heat sink 340 includes a plurality of heat dissipation fins 342 to increase the cooling effect, and is provided with a screw assembly hole 343 so as to be assembled with the upper portion of the heat sink frame 320 by a screw 344. Preferably, the screw 344 is inserted into a third elastic body S3 to keep the heat sink 340 and the heat sink frame 320 in close contact with each other, thereby stably maintaining the pressing force on the IC during the IC test process. Meanwhile, in the embodiment of the present disclosure, the first, second, and third elastic bodies S1, S2, and S3 are described by taking a compression coil spring as an example, but are not limited thereto. In addition, each of the elastic bodies S1, S2, and S3 are provided in plurality, and the elastic bodies S1, S2, and S3 are arranged left-right and/or top-down symmetrical to apply a uniform pressing force to the IC.

The socket device according to another embodiment of the present disclosure is the same as the previous embodiment in that, in conjunction with the open/close rotation operation of the handle 260, the heat sink frame 320, the pusher block 330, and the heat sink 340, which are pressurized parts, move up and down at the top of the lead frame 210 to provide pressing force to the IC. In particular, this embodiment is effective for IC packages that have a step difference between the central and peripheral portions of the upper surface.

To be specific, referring to FIGS. 10 to 12, in the state of the handle being closed, the first elastic bodies S1 inserted between the lead frame 210 and the heat sink frame 320 have an upward reaction force and are compressed to the maximum displacement. In addition, as described in the previous embodiment, in the state of the handle being closed, the heat sink frame 320 moves downward and the pressurizing surface 341 of the heat sink 340 pressurizes the upper portion of the IC by the compressive elastic force of the second elastic bodies S2 and the third elastic bodies S3 to provide a pressing force to the IC.

In particular, referring to FIGS. 11 and 12, in the state of the handle being closed, the pressurizing surface 341 of the heat sink 340 pressurizes the central portion of the upper surface of the IC, and at this time, the heat sink 340 is lifted upward and separated from the heat sink frame 320. Due to a height g1 of this separation, the third elastic body S3 into which the screw 344 is inserted is compressed, and the third elastic body S3 exerts a pressing force on the central portion of the upper surface of the IC.

Meanwhile, the pusher block 330 pressurizes the peripheral portion having a step difference from the center of the IC upper surface. At this time, the pusher block 330 is lifted upward and separated from the bolt head 232a of the stopper bolt 232 fastened to the heat sink frame 320, and due to a height g2 of this separation, the second elastic body S2 is compressed, the second elastic body S2 exerts a pressing force on the periphery of the upper surface of the IC. For reference, as described in the previous example (see FIG. 6), in the state of the handle being closed, the heat sink frame 320 is positioned downward by a predetermined height h relative to the lead frame 210, and the second elastic body S2 is compressed by the downward displacement amount h of the heat sink frame 320 and the upward displacement amount g2 of the pusher block 330 to pressurize the peripheral portion of the upper surface of the IC.

Figure 13:
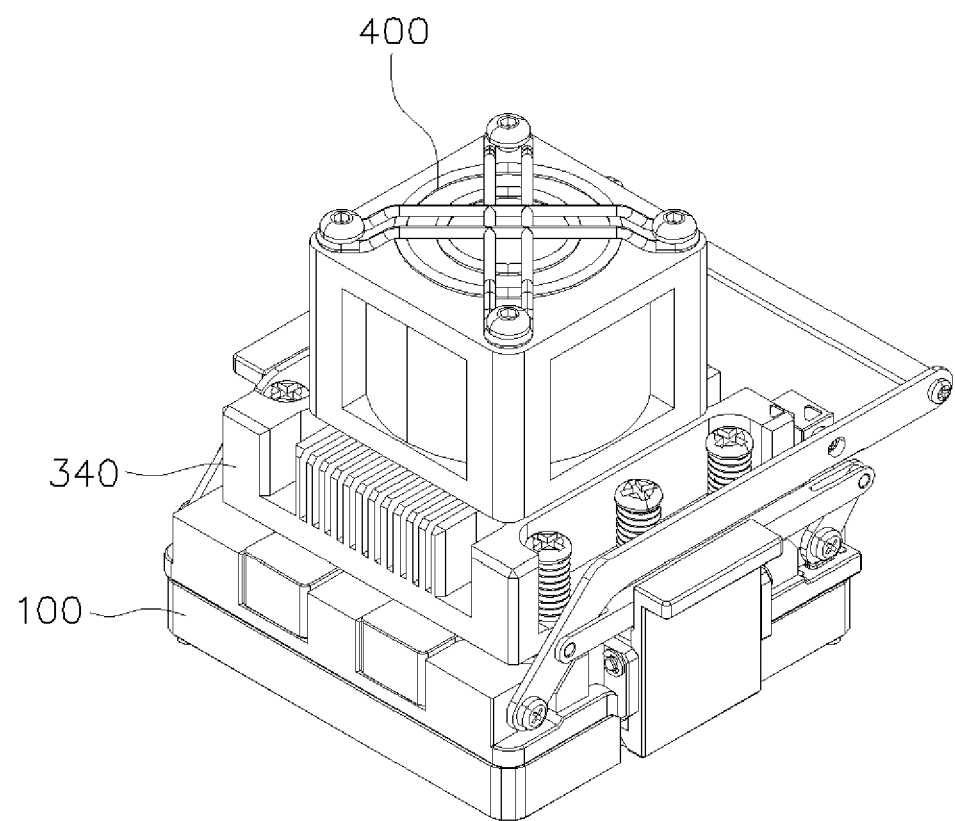
FIG. 13 is a perspective view of a socket device for testing integrated circuits (ICs) according to still another embodiment of the present disclosure.

FIG. 13 is a perspective view of a socket device for testing integrated circuits (ICs) according to still another embodiment of the present disclosure, and a cooling fan 400 may be added to the top of the heat sink 340.

As above, although the present disclosure has been described with limited embodiments and drawings, the scope of the present disclosure is not limited thereto, and various modifications and variations may be made by those skilled in the art in the technical field to which the present disclosure belongs within the scope of equivalency of the technical idea of the present disclosure and the claims set forth below.

What is claimed is:

1. A socket device for testing integrated circuits (ICs), comprising:
   a contact module for seating an IC and having a plurality of contacts for electrical connection of a lead of the IC and a terminal of a printed circuit board (PCB); and
   a pusher module having a latch to be fit-assembled from a top of the contact module and for pressurizing the IC,
   wherein the pusher module comprises:
   a lead frame with the latch rotatably provided thereto;
   a pressurizing part assembled to the lead frame with two floating hinge axes parallel to each other and elastically supported against the lead frame to be movable up and down to elastically pressurize the IC;
   first and second cam shafts provided in the respective floating hinge axes to adjust a vertical height of the pressurizing part depending on a rotation angle thereof;
   a handle rotatably fixed with the first cam shaft;
   a lever rotatably fixed with the second cam shaft; and
   a link having opposite ends rotatably connected to the handle and the lever.

2. The socket device of claim 1, wherein the pressurizing part comprises:
   a heat sink frame having a first elastic body disposed and assembled with the lead frame by means of the first and second cam shafts; and
   a pusher block provided with a second elastic body to be elastically supported against the heat sink frame and having a pressurizing surface that elastically pressurizes the IC.

3. The socket device of claim 2, wherein each of the first and second cam shafts comprises:
   a first section having a circular cross-section and rotatably assembled with the lead frame; and a second section extending from the first section and having a cam surface that forms a plane in an axial direction on a portion of an outer peripheral surface of each of the first and second cam shafts to be assembled with the heat sink frame.

4. The socket device of claim 3, wherein the heat sink frame includes a floating hinge part formed with a floating hinge hole through which each of the first and second cam shafts is inserted, wherein the floating hinge hole has a flat surface that makes surface contact with the cam surface.

5. The socket device of claim 2, wherein the heat sink frame and the pusher block are respectively provided with a first opening and a second opening formed through approximately a center thereof, and a heat sink is further comprised, the heat sink being equipped with a plurality of heat dissipation fins, provided on top of the heat sink frame, inserted into the first and second openings, and having a pressurizing surface that pressurizes an IC.

6. The socket device of claim 5, wherein the heat sink is provided with a third elastic body and is elastically assembled with the heat sink frame.

7. The socket device of claim 5, wherein the heat sink is further provided with a cooling fan for cooling.

8. A pusher device for being assembled with a contact module of a socket device to electrically connect a lead of an IC and a terminal of a printed circuit board (PCB) to pressurize the IC, the pusher device comprising:
- a lead frame with a latch rotatably provided thereto to be fit-assembled from a top of the contact module;
- a pressurizing part assembled to the lead frame with two floating hinge axes parallel to each other and elastically supported against the lead frame to be movable up and down to elastically pressurize the IC;
- first and second cam shafts provided in the respective floating hinge axes to adjust a vertical height of the pressurizing part depending on a rotation angle thereof;
- a handle rotatably fixed with the first cam shaft;
- a lever rotatably fixed with the second cam shaft; and
- a link having opposite ends rotatably connected to the handle and the lever.

* * * * *